US010396807B1

(12) United States Patent
Dai et al.

(10) Patent No.: US 10,396,807 B1
(45) Date of Patent: Aug. 27, 2019

(54) MULTI-RING COUPLED RING OSCILLATOR WITH IMPROVED PHASE NOISE

(71) Applicant: Auburn University, Auburn, AL (US)

(72) Inventors: Fa Dai, Auburn, AL (US); Ruixin Wang, Auburn, AL (US)

(73) Assignee: Auburn University, Auburn, AL (US)

( * ) Notice: Subject to any disclaimer, the term of this patent is extended or adjusted under 35 U.S.C. 154(b) by 63 days.

(21) Appl. No.: 15/819,124

(22) Filed: Nov. 21, 2017

Related U.S. Application Data

(63) Continuation-in-part of application No. 15/427,847, filed on Feb. 8, 2017, now abandoned.
(Continued)

(51) Int. Cl.
*H03K 3/013* (2006.01)
*H03K 3/03* (2006.01)
(Continued)

(52) U.S. Cl.
CPC ........... *H03L 7/0995* (2013.01); *H03K 3/013* (2013.01); *H03K 3/0322* (2013.01); *H03L 7/07* (2013.01)

(58) Field of Classification Search
CPC .... H03K 3/013; H03K 3/0315; H03K 3/0322; H03L 7/0995–0998
(Continued)

(56) References Cited

U.S. PATENT DOCUMENTS 5,592,127 A * 1/1997 Mizuno ................ H03K 3/0315
331/172
6,188,291 B1 * 2/2001 Gopinathan ............ H03B 27/00
331/172
(Continued)

OTHER PUBLICATIONS

Abdul-Latif et al., "Low Phase Noise Wide Tuning Range N-Push Cyclic-Coupled Ring Oscillators", IEEE Journal of Solid-State Circuits, Jun. 2012, 47(6):1278.
(Continued)

*Primary Examiner* — Levi Gannon
(74) *Attorney, Agent, or Firm* — Christopher M. Scherer; DeWitt LLP

(57) ABSTRACT

The disclosure of the present application presents a multiple-ring coupled ring oscillator design that employs multiple-ring coupling to achieve improved phase noise by minimizing noise injection from tail current and adjacent rings, while providing additional output phases for multiphase signal generation. In one non-limiting exemplary prototype embodiment, a 1.5 GHz triple-ring coupled ring oscillator achieved measured phase noise of –110.5 dBc/Hz at 1 MHz offset, demonstrating phase noise reduction of 7 dB compared with its single-ring oscillator counterpart. The MROs couple multiple rings with proper phase shifting to achieve improved phase noise. Common source coupling benefits from tail current noise reduction, and introducing phase delays in the coupling paths minimizes noise coupling from the adjacent cores. The overall effect leads to improved phase noise performance as demonstrated in quadrature voltage controlled VCO designs. The concept is applied to ring oscillator designs and, as stated previously, demonstrates a triple-ring coupled ring oscillator with phase noise improvement. The design of the present application also triples the number of output phases compared to its single ring oscillator counterpart. The application of injection-locked PLL by using proposed multiple ring coupled ring oscillator achieves the same low phase noise as traditional IL-PLL does while lowering the reference spur at auxiliary ring's output. In another non-limiting exemplary embodiment, the proposed IL-PLL consumes 13.5 mW of power, while achieving in-band phase noise of –120.97 dBc/Hz at 1 MHz offset at 1.1 GHz output frequency.

19 Claims, 15 Drawing Sheets

Related U.S. Application Data

(60) Provisional application No. 62/292,553, filed on Feb. 8, 2016.

(51) Int. Cl.
 *H03L 7/099* (2006.01)
 *H03L 7/07* (2006.01)

(58) Field of Classification Search
 USPC .......................................................... 331/57
 See application file for complete search history.

(56) References Cited

U.S. PATENT DOCUMENTS

| | | | |
|---|---|---|---|
| 8,138,958 B2 | 3/2012 | Dai et al. | |
| 8,232,843 B2* | 7/2012 | Dubey | H03K 3/0315 331/45 |
| 9,979,284 B2* | 5/2018 | Jung | H02M 1/36 |
| 2006/0001496 A1* | 1/2006 | Abrosimov | H03K 3/0322 331/57 |
| 2007/0290930 A1* | 12/2007 | Krishnaswamy | H01Q 3/26 343/700 MS |
| 2009/0045882 A1* | 2/2009 | Kim | H03K 3/0315 331/57 |
| 2010/0176889 A1* | 7/2010 | Nix | H03K 3/0315 331/57 |
| 2017/0373697 A1* | 12/2017 | Schober | H03L 7/24 |

OTHER PUBLICATIONS

Choi et al., "A 185fsrms-Integrated-Jitter and -245dB FOM PVT-Robust Ring-VCO-Based Injection-Locked Clock Multiplier with a Continuous Frequency-Tracking Loop Using a Replica-Delay Cell and a Dual-Edge Phase Detector", ISSCC 2016/Session 10/Advanced Wireline Transceivers and PLLs/10.7, Feb. 2, 2016, 194.

Deng et al., "A 0.048mm2 3mW Synthesizable Fractional-N PLL with a Soft Injection-Locking Technique", ISSCC 2015/Session 14/Digital PLLS and SOC Building Blocks/14.1, Feb. 24, 2015, 3.

Elkholy et al., "A 6.75-to-8.25GHz 2.25mW 190fsrms Integrated-Jitter PVT-Insensitive Injection-Locked Clock Multiplier Using All-Digital Continuous Frequency-Tracking Loop in 65nm CMOS", ISSCC 2015/Session 10/Advanced Wireline Techniques and PLLs/10.7, Feb. 24, 2015, 188.

Gao et al., "Spur Reduction Techniques for Phase-Locked Loops Exploiting A Sub-Sampling Phase Detector", IEEE Journal of Solid-State Circuits, Sep. 2010, 45(9):1809.

Hsu et al., "A Sub-Sampling-Assisted Phase-Frequency Detector for Low-Noise PLLs With Robust Operation Under Supply Interference", IEEE Transactions on Circuits and Systems-I:Regular Papers, Jan. 2015, 62(1):90.

Lee et al., "An Injection Locked PLL for Power Supply Variation Robustness Using Negative Phase Shift Phenomenon of Injection Locked Frequency Divider", IEEE, 2015.

Liang et al., "A Wideband Fractional-N Ring PLL Using a Near-Ground Pre-Distorted Switched-Capacitor Loop Filter", ISSCC 2015/Session 10/Advanced Wireline Techniques and PLLs/10.8, Feb. 24, 2015, 190.

Mirzaei et al., "The Quadrature LC Oscillator: A Complete Portrait Based on Injection Locking", IEEE Journal of Solid-State Circuits, Sep. 2007, 42(9):1916.

Nandwana et al., "A Calibration-Free Fractional-N Ring PLL Using Hybrid Phase/Current-Mode Phase Interpolation Method", IEEE Journal of Solid-State Circuits, Apr. 2015, 50(4):882.

Pankratz et al., "Multiloop High-Power-Supply-Rejection Quadrature Ring Oscillator", IEEE Journal of Solid-State Circuits, Sep. 2012, 47(9):2033.

Sheng Ye et al., "A Multiple-Crystal Interface PLL With VCO Realignment to Reduce Phase Noise", IEEE Journal of Solid-State Circuits, Dec. 2002, 37(12):1795.

Soltanian et al., "A Low Phase Noise Quadrature LC VCO Using Capacitive Common-Source Coupling", IEEE, 2006.

Wang et al., "A 1~1.5 GHz Capacitive Coupled Inductor-less Multi-ring Oscillator with Improved Phase Noise", IEEE, 2016.

Zhai et al., "A N-path Filter Enhanced Low Phase Noise Ring VCO", 2014 Symposium on VLSI Circuits Digest of Technical Papers, IEEE, 2014.

Zhao et al., "A 0.6-V Quadrature VCO With Enhanced Swing and Optimized Capacitive Coupling for Phase Noise Reduction", IEEE Transactions of Circuits and Systems-I:Regular Papers, Aug. 2012, 59(8):1694.

* cited by examiner

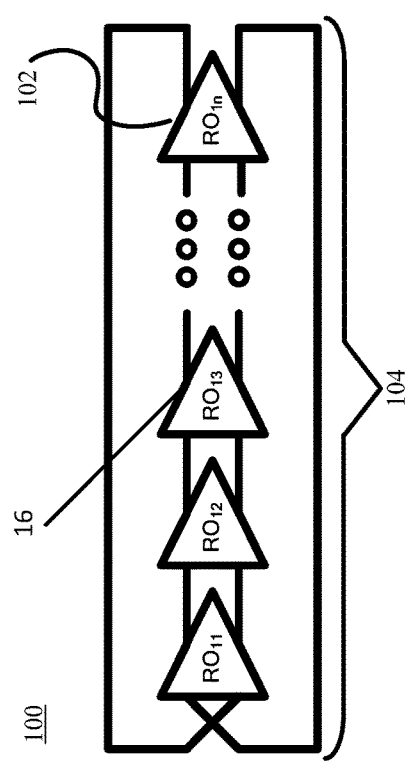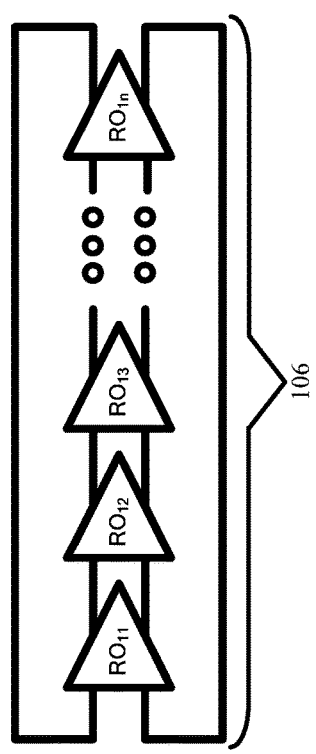
Fig. 1a
(Prior Art)
Fig. 1b
(Prior Art)

MULTI-RING COUPLED RING OSCILLATOR WITH IMPROVED PHASE NOISE

CROSS-REFERENCE TO RELATED APPLICATIONS

The present application is a continuation-in-part of U.S. application Ser. No. 15/427,847, filed Feb. 8, 2017, which application claims priority to U.S. Provisional Application No. 62/292,553, filed Feb. 8, 2016, the contents of which are incorporated herein by reference in their entireties.

FIELD

The present disclosure is related to ring oscillators and phase-locked loops (PLL), in particular to employing the novel multiple-ring coupling technique for ring oscillators and ring oscillator-based PLL for improving phase noise performance, reducing reference spur in the injection-locked PLL.

BACKGROUND

Multi-phase clock generation is critical for emerging technologies such as phase array, beam forming, passive mixing, N-path filtering and interleaved data converters. Multi-phase signals can be generated by ring oscillators with either resistive load or inductor/capacitor (LC) based differential gain stages (also known as delay cells). Ring oscillators without an LC tank circuit normally end up with unacceptable phase noise for most wireless applications. It is thus highly desirable to push the phase noise of ring oscillators towards what LC-based oscillators can reach. Recent researches on injection-locked ring oscillators showed promising phase noise performance with the help of off-chip reference sources. N-path filters are also used to enhance the equivalent quality factor of the ring for improved phase noise.

A classical structure of ring oscillator 100 is illustrated in FIG. 1a and FIG. 1b. The differential inverter 102 based ring oscillator comprises multiple differential gain stages 16 with either even 104 or odd 106 number of differential gain stages 16 connected in series. As illustrated in FIG. 2a and FIG. 2b, the differential gain stages 200 could be constructed with (but not limited to) either resistive load 202 or active load 208, which experiences a total amount of phase shifting of $2\pi$ to sustain oscillation. The phase noise of ring oscillator 100 is determined by the noise sources from the loading 202 or 208, switching transistors 204 and current source transistors 206.

Properties of poor phase noise in ring oscillators can be relieved by injection locking, which is realized by injecting a periodic signal into the oscillator, leading to improved phase noise performance. Recent researches on injection-locked ring oscillators with PLLs showed promising phase noise performance with the help of off-chip reference sources. With the greatly reduced in-band noise, the loop bandwidth can be widened to help reducing the oscillator's phase noise, enabling inductor-less low jitter frequency synthesis. A prior art injection-locked phase lock loop (IL-PLL) 300 in FIG. 3 is composed of a digitally controlled delay line (DCDL) 302, pulse generator 304, phase and frequency detector/charge pump (PFD/CP) 306, loop filter (LF) 308, divider 314 and voltage controlled oscillator (VCO) 310. The reference signal is shaped into tiny pulse by the pulse generator and then is forwarded into VCO, which leads to the improved in-band phase noise. However, the traditional IL-PLL suffers from high reference spur due to injection process. As illustrated in FIG. 11, reference spurs in IL-PLL mainly comes from two sources: (i) timing mismatches between injection signal and the oscillation waveform and (ii) distortion in the output waveforms induced by injection pulses as illustrated in FIG. 11. Due to non-ideal injection, the output waveform will be distorted and the distortion repeats every reference cycle even if the injection occurs at the waveform's zero-crossing points. This periodic distortion causes reference spur in output spectrum. Pulse width TD sets the lower bound of the reference spur level in conventional IL-PLLs. Moreover, in ring oscillator based IL-PLLs, the distorted waveform in one stage will propagate through other stages, leading to high reference spurs in every output phases. Timing mismatches can be calibrated by using conventional charge pump PLL, as shown in FIG. 3, to track the reference clock as its Nth sub-harmonic, where N is the loop division ratio. However, the distortion in the output waveform from injection pulse cannot be eliminated in prior art injection-locked PLLs.

SUMMARY OF THE DISCLOSURE

The disclosure of the present application presents a multiple-ring coupled ring oscillator design that employs multiple-ring coupling to achieve improved phase noise by minimizing noise injection from tail current and adjacent rings, while providing additional output phases for multi-phase signal generation. In one non-limiting exemplary prototype embodiment, a 1.5 GHz triple-ring coupled ring oscillator achieved measured phase noise of −110.5 dBc/Hz at 1 MHz offset, demonstrating phase noise reduction of 7 dB compared with its single-ring oscillator counterpart. The MROs couple multiple rings with proper phase shifting to achieve improved phase noise. Common source coupling benefits from tail current noise reduction, and introducing phase delays in the coupling paths minimizes noise coupling from the adjacent cores. The overall effect leads to improved phase noise performance as demonstrated in quadrature voltage controlled VCO designs. The concept is applied to ring oscillator designs and, as stated previously, demonstrates a triple-ring coupled ring oscillator (TRO) with phase noise improvement for example at 1.5 GHz. The design of the present application also triples the number of output phases compared to its single ring oscillator (SRO) counterpart.

The present application is directed to a ring oscillator for improving phase noise performance and additional output phases.

The present application is also directed to a ring oscillator based injection locked PLL for improving phase noise performance and reducing the reference spur through common source coupling between ring oscillators. The common mode nodes in MRO are coupled together such that the common mode node of each ring is connected to other rings' common mode node through capacitors or phase shifters. The MRO based injection-locked PLL is implemented with multiple-ring coupled ring oscillators where the injection signal is forwarded into the injection transistor to reset the jitter accumulation in PLL every reference cycle. The injection transistor is connected between ring oscillator's differential outputs to align the oscillator's waveform with the reference signal shown in FIG. 14.

The present application is also directed to a ring oscillator for subsampling PLL with soft switching technique.

The present application is also directed to a ring oscillator for generic PLL for improving phase noise and jitter performance.

In an additional embodiment of the present application, an apparatus comprising a plurality of ring oscillator circuits, each of the plurality of ring oscillators having common mode nodes, wherein the plurality of common mode nodes are coupled with one another, such that a current source noise is reduced, and further wherein the plurality of ring oscillator circuits have a phase shift of 180/M degrees between the outputs of the plurality of ring oscillators circuits, where M is the number of ring oscillator circuits, such that a phase delay of the phase shift creates a noise reduction in an output of the apparatus.

In an additional embodiment, the above apparatus includes one input and a plurality of outputs numbering 2MN.

An additional embodiment includes the above apparatus as well as a digitally controlled delay line in fine tuning having an input receiving a reference signal and an output connected to an input of a pulse generator, the pulse generator having an output connected to the input of the main ring oscillator circuit to transmit the injection pulse; a phase and frequency detector/charge pump having a plurality of inputs and an output, wherein one of the plurality of inputs receives the reference signal and the other of the plurality of inputs is connected to the output of a divider; a loop filter having an input connected to the output of the phase and frequency detector/charge pump and an output connected to the input of the at least one auxiliary ring oscillator circuit to transmit the control voltage; and a second stage M to 1 multiplexer in coarse tuning having M inputs connected to each first stage 2N to 1 multiplexer and an output connected to the input of the divider.

BRIEF DESCRIPTION OF THE DRAWINGS

FIG. 1a and FIG. 1b are block diagrams illustrating ring oscillators of the prior art.

DETAILED DESCRIPTION OF THE DRAWINGS

In the present description, certain terms have been used for brevity, clearness and understanding. No unnecessary limitations are to be applied therefrom beyond the requirement of the prior art because such terms are used for descriptive purposes only and are intended to be broadly construed. The different systems and methods described herein may be used alone or in combination with other systems and methods. Various equivalents, alternatives and modifications are possible within the scope of the appended claims. Each limitation in the appended claims is intended to invoke interpretation under 35 U.S.C. § 112, sixth paragraph, only if the terms "means for" or "step for" are explicitly recited in the respective limitation.

Current systems include ring oscillators that are formed with multiple differential gain stages connected in a ring configuration. In order to operate at high frequency with a large number of available output phases, more differential gain stages with reduced delays are required, which leads to increased power consumption. Phase noise arises from the mismatches among the differential gain stages. To achieve the same output frequency under the same power consumption, the larger the number of output phases are, the worse the phase noise becomes. This dilemma can be solved by splitting the differential gain stages into multiple rings and allow each ring to oscillate at the same frequency, yet with correlated phase relationship through coupling. However, coupling additional rings turns out to be critical to the overall phase noise performance. If proper phase shifting is introduced through the coupling, noise generated in the adjacent rings will be injected at the peak swing of the oscillation waveform in the main ring, which is the least sensitive instance for its phase noise performance. If capacitive coupling is done at the common mode nodes of the differential gain stages, i.e., common source coupling, additional benefit can be obtained through tail current noise reduction. Hence, the MRO of the present application improves upon previous solutions by breaking the tradeoff between the number of phases and the oscillation frequency while gaining benefit of phase noise reduction.

One aspect of the present application is directed to such a ring oscillator. The ring oscillator comprises multiple classical ring oscillators that are coupled at the common mode nodes. The differential pairs in each ring are connected in the series to form a ring oscillator. The coupling capacitors are connected in between each ring such that every ring oscillator in the MRO is connected with other ring oscillators. The output frequency of the MRO is determined by total amount of delay experienced in a SRO, while the coupling scheme between the rings ensures their relative phase relationship.

Figure 2B:
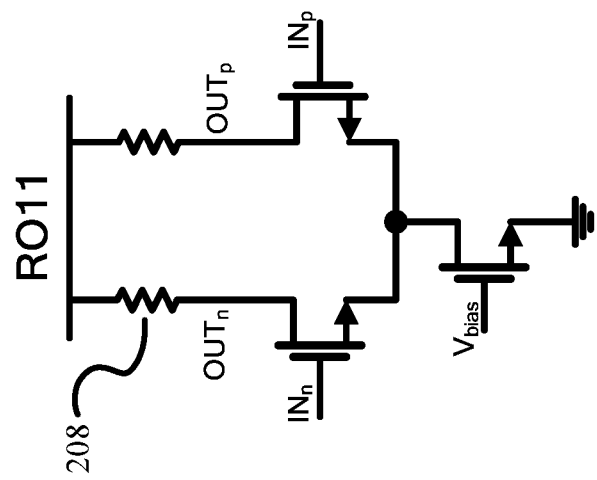
FIG. 2a and FIG. 2b are schematic diagrams illustrating the unit stages in ring oscillators of the prior art.
Figure 2A:
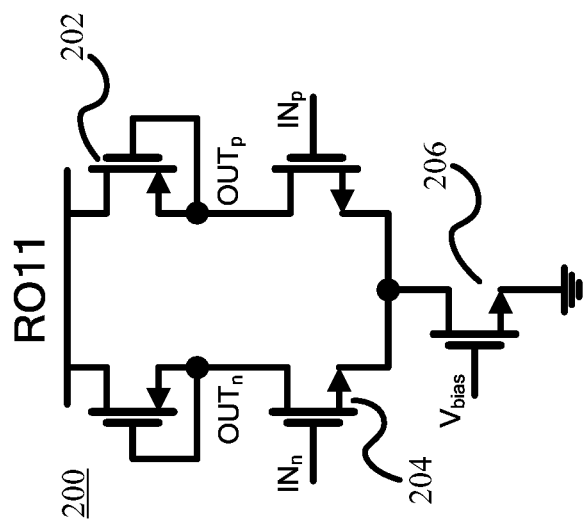
Figure 3:
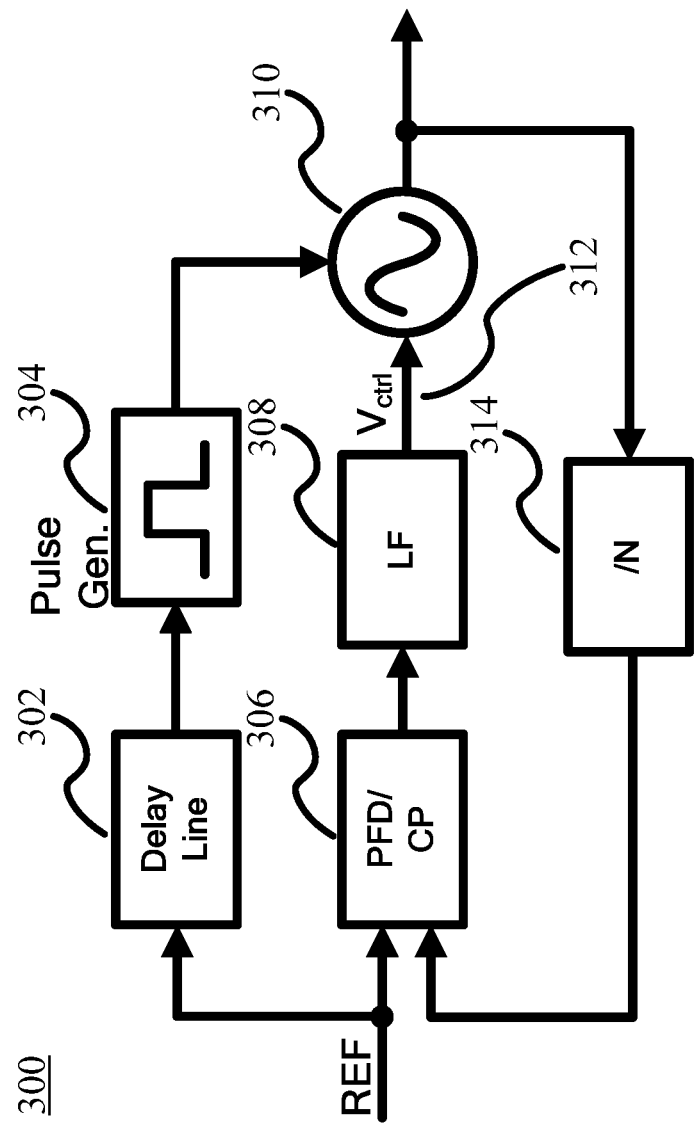
FIG. 3 is a block diagram illustrating an injection-locked phase lock loop of the prior art.
Figure 4B:
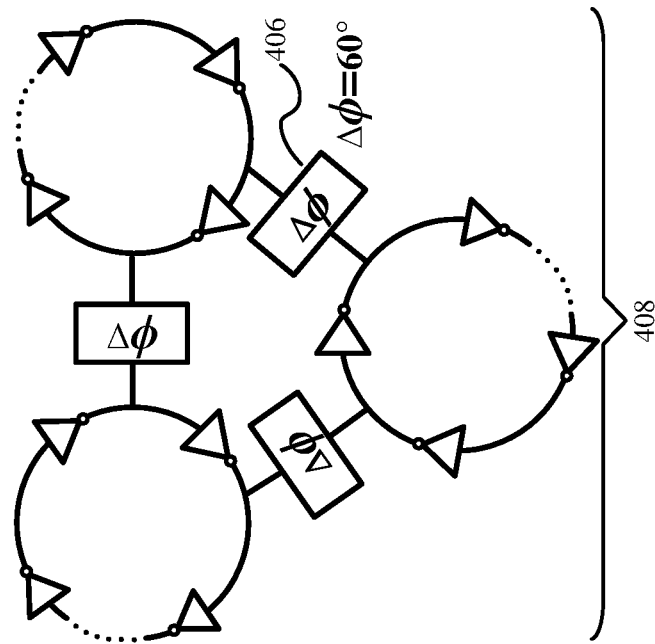
FIG. 4b is a block diagrams illustrating an exemplary embodiment of a TRO according to the present application.
Figure 4A:
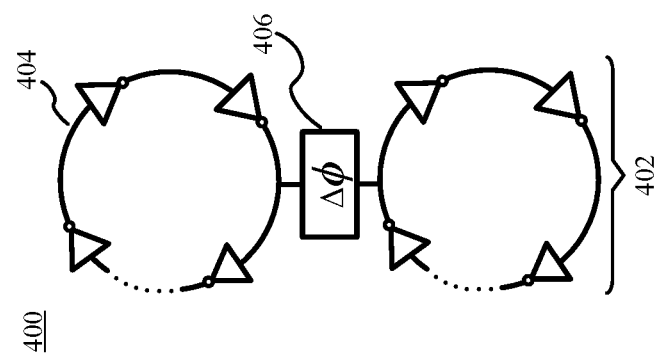
FIG. 4a is a block diagram illustrating an exemplary embodiment of a double-ring coupled ring oscillator (DRO) according to the present application.

FIG. 4a is a block diagram illustrating a DRO 402. As illustrated in FIG. 4a, a DRO 402 is formed by connecting two ring oscillators 404 through capacitive coupled paths 406 with a 90° phase shift. The ring oscillators 404 include a number of differential gain stages 16. In a DRO 402, the phase shift is only 90°. Referring now to FIG. 4b, a TRO 408 may be constructed by connecting three ring oscillators 404 through capacitive coupled paths 406 with 60° phase shift, which ensures that the noise coupled from the adjacent rings 404 are not aligned at the sensitive instance for phase noise performance. The output frequency of the MRO, in this case the TRO 408 is determined by the total amount of delay experienced in a SRO, while the coupling scheme 406 between the rings 404 ensures their relative phase relationship. It should be noted that any device described herein having more than one ring oscillator may be properly referred to as an MRO.

Figure 5C:
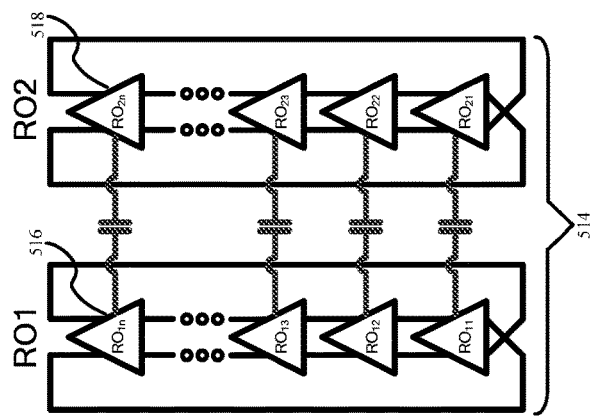
FIGS. 5a and 5c are block diagrams illustrating an exemplary embodiment of a DRO according to the present application.
Figure 5B:
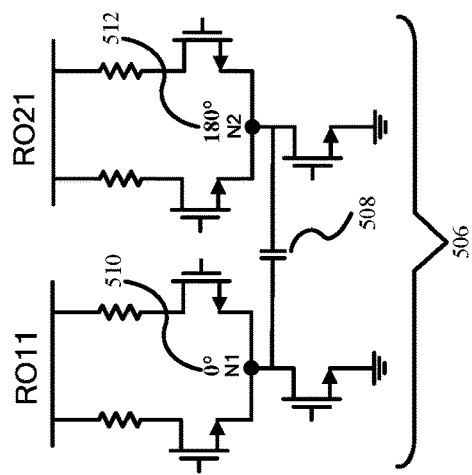
FIG. 5b is a schematic diagram illustrating an exemplary embodiment of a DRO according to the present application.
Figure 5A:
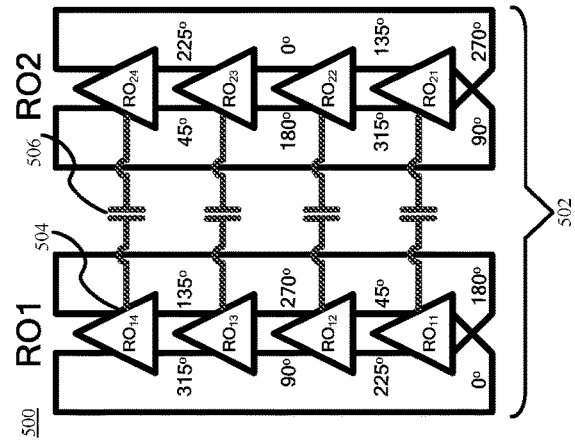
Figure 6C:
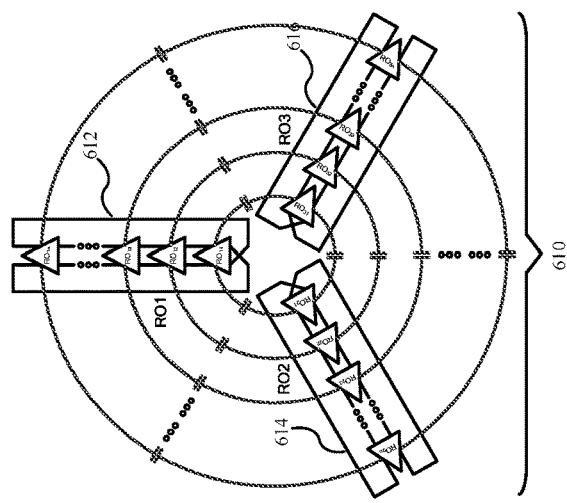
FIGS. 6a and 6c are block diagrams illustrating an exemplary embodiment of a TRO according to the present application.
Figure 6B:
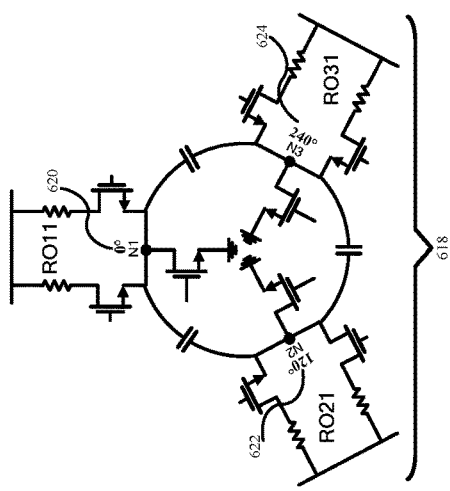
FIG. 6b is a schematic diagram illustrating an exemplary embodiment of a TRO according to the present application.
Figure 6A:
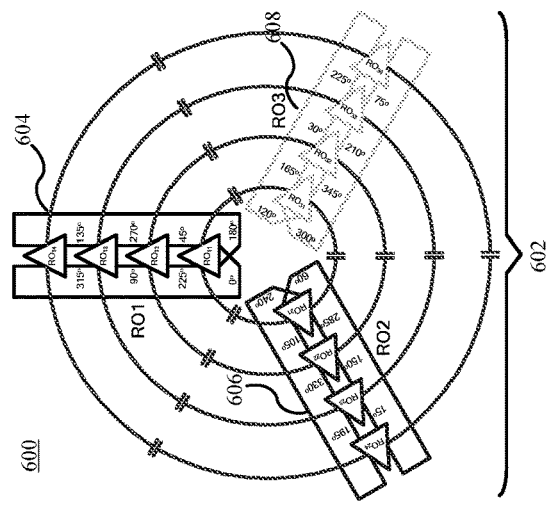
Figure 7C:
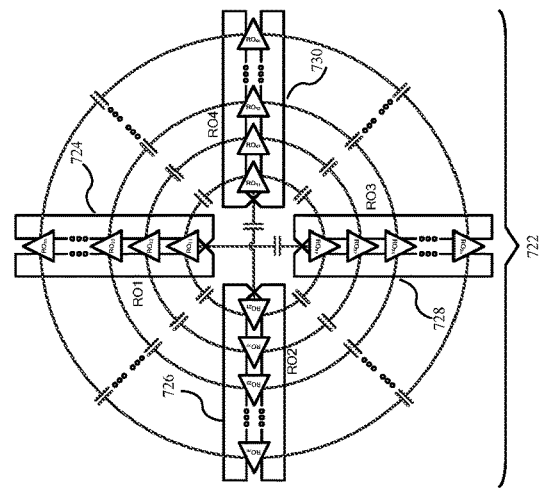
FIGS. 7a and 7c are block diagrams illustrating an exemplary embodiment of a four-ring coupled ring oscillator according to the present application.
Figure 7B:
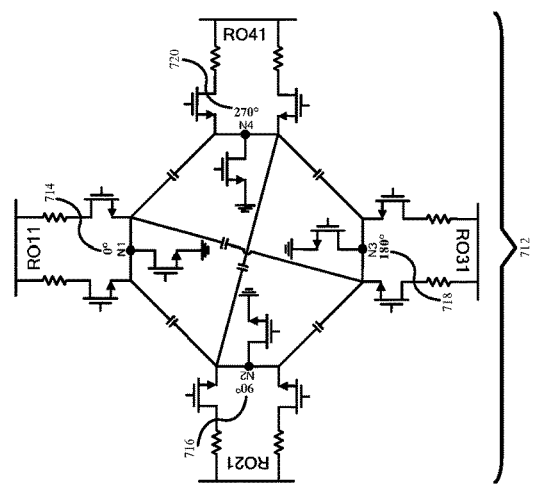
FIG. 7b is a schematic diagram illustrating an exemplary embodiment of a four-ring coupled ring oscillator according to the present application.
Figure 7A:
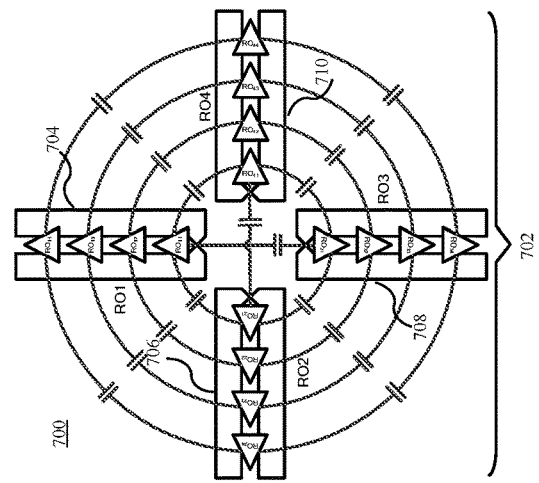

The MRO is further illustrated with block and circuit diagrams given in FIGS. 5a, 6a and 7a where two, three and four identical rings are implemented with 4 differential gain stages per ring, respectively. For instance, in FIG. 5a, the phase of output signals in ring oscillator no. 1 (RO1) of DRO 502 is spaced equally from 0° to 315° with 90° for generic ring oscillator. Due to coupling, the output phases in RO2 have 90° phase shift from RO1, such that the output phases of differential gain stage RO14 504 are 0° and 180°, respectively and the output phases of RO24 506 are 90° and 270°, respectively. The number of differential gain stages in a single ring oscillator can be any number N that is no less than 3. The block diagram of DRO 514 with N differential gain stages is further illustrated in FIG. 5c. The ring oscillator 514 is comprised of differential gain stages with resistive load shown in FIGS. 5b, 6b and 7b coupled by the capacitors 506. The coupling between the rings are accomplished by connecting the common mode nodes of the differential gain stages 516, 518 with capacitors 506. The coupling scheme is further illustrated in FIG. 10a, FIG. 10b, FIG. 10c, FIG. 10d and FIG. 10e, where the dot 1004 means the common mode nodes N1-N6 of one ring oscillator and line 1006 determines the coupling path between two common mode nodes N1-N6. FIG. 10a, FIG. 10b, FIG. 10c, FIG. 10d, and FIG. 10e of 1002, 1008, 1010, 1012 and 1014 show the coupling scheme in between DRO, TRO, 4-ring coupled ring oscillator, 5-ring coupled ring oscillator, and 6-ring coupled ring oscillator, respectively. This common-source coupling scheme has two advantages: (i) the coupling capacitors provide phase shifting that minimizes the 1/f noise up-conversion generated by the current sources; (ii) the capacitive coupling provides needed phase shifting that minimizes the noise injection from the adjacent rings. As a result, the overall phase noise obtained from the TRO is greatly improved compared with its SRO counterpart. Note that the capacitive coupling doesn't use any additional active devices, which would add extra noise and power, nor does the coupling block load any output nodes of the differential gain stages, which would limit the frequency response of the oscillator. Generally speaking, common source coupling has ignorable effect on oscillator's frequency response, while it helps phase noise reduction.

Figure 8:
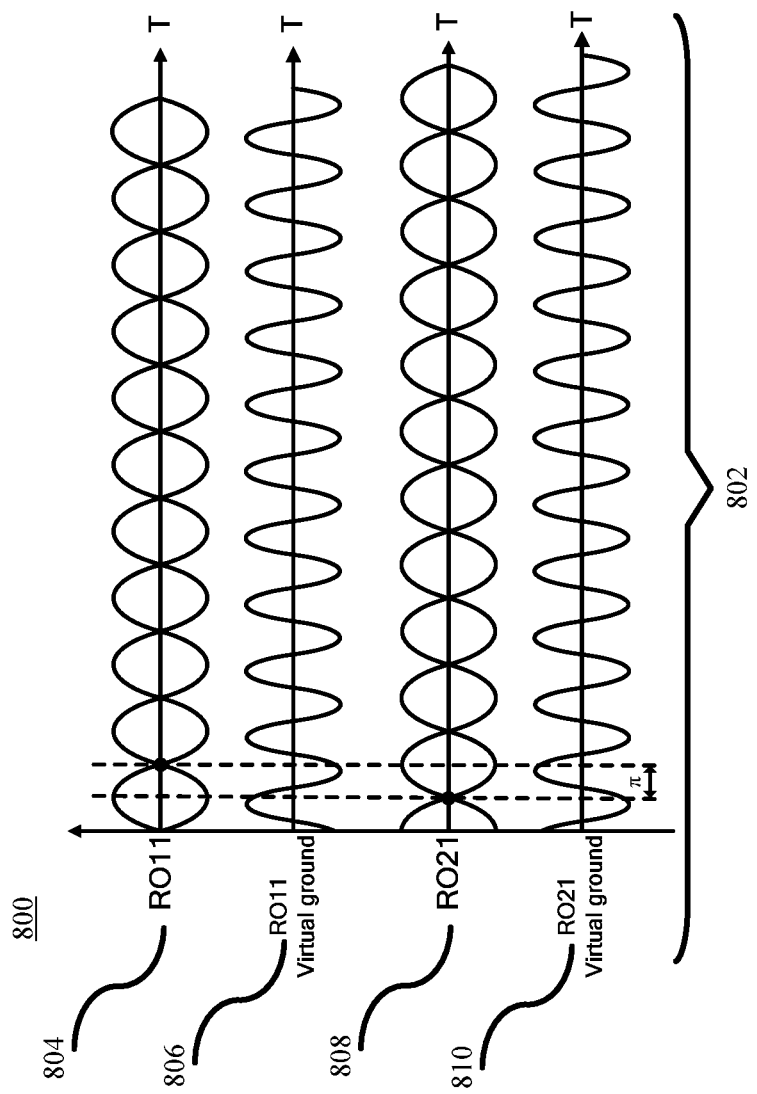
FIG. 8 is a graphical representation of a timing diagram of exemplary differential gain stages in a DRO of the present application.
Figure 9:
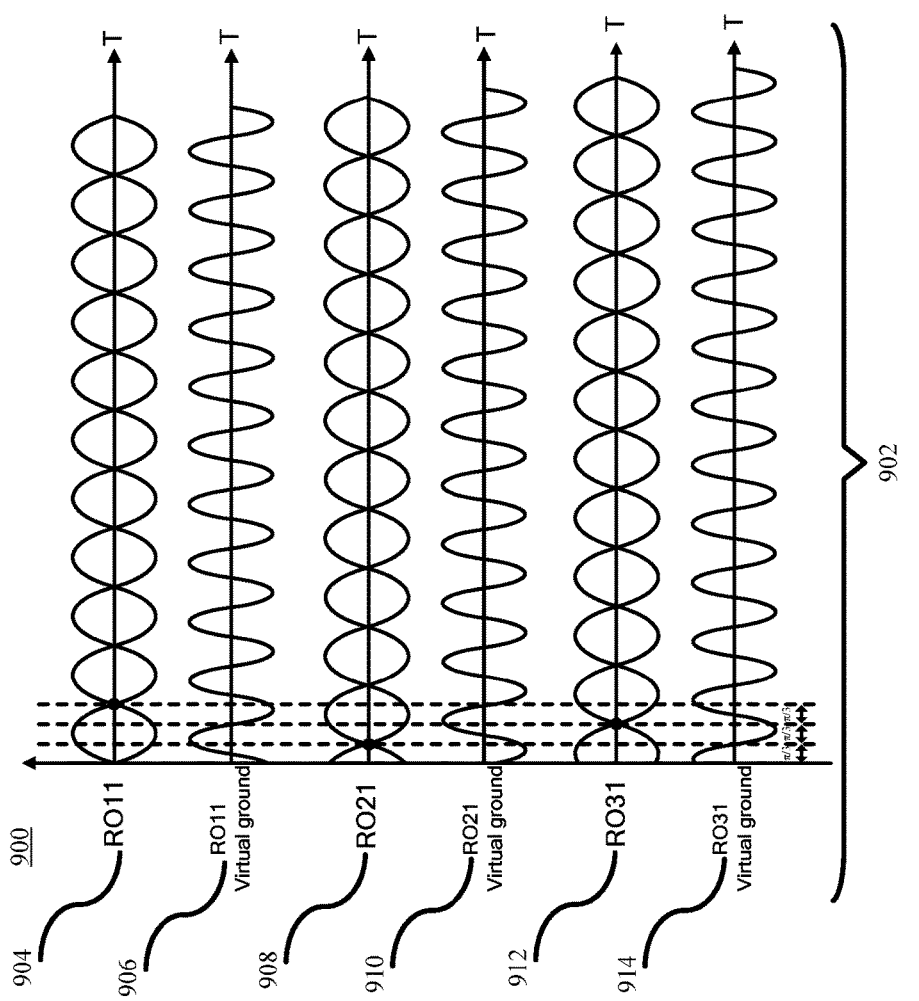
FIG. 9 is a graphical representation of a timing diagram of exemplary differential gain stages in a TRO of the present application.
Figure 10C:
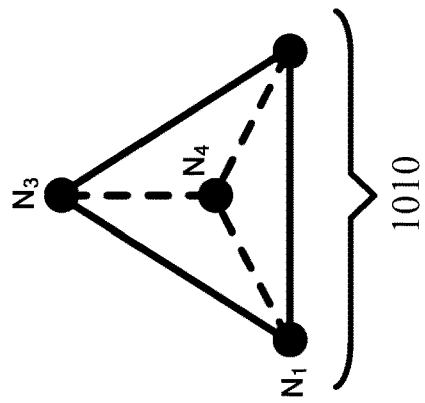
FIG. 10c is a block diagram illustrating a coupling scheme of an exemplary embodiment of a four-ring coupled ring oscillator according to the present application.
Figure 10B:
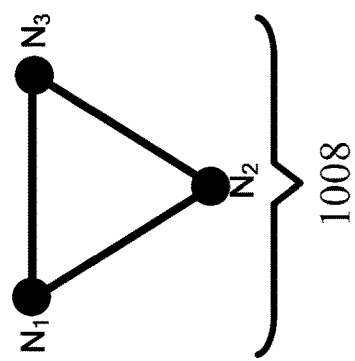
FIG. 10b is a block diagram illustrating a coupling scheme of an exemplary embodiment of a TRO according to the present application.
Figure 10A:
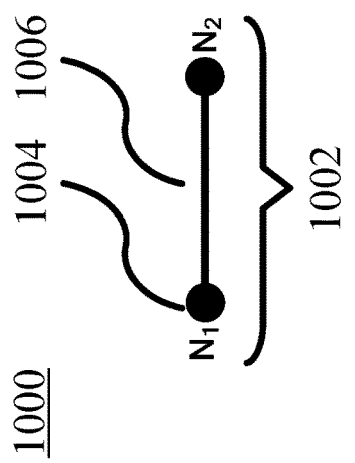
FIG. 10a is a block diagram illustrating a coupling scheme of an exemplary embodiment of a DRO according to the present application.
Figure 10E:
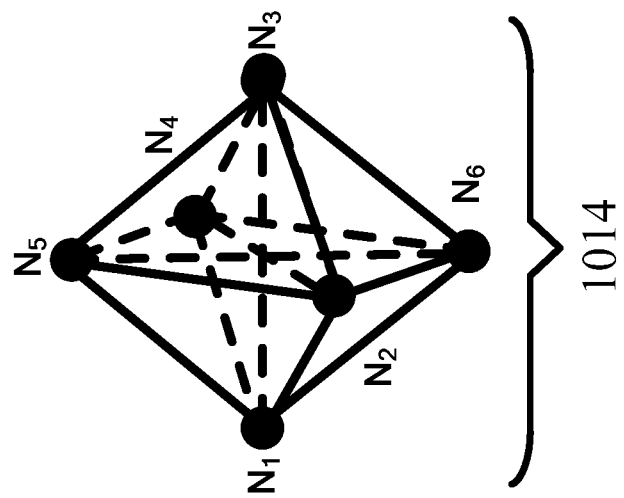
FIG. 10e is a block diagram illustrating a coupling scheme of an exemplary embodiment of a six-ring coupled ring oscillator according to the present application.
Figure 10D:
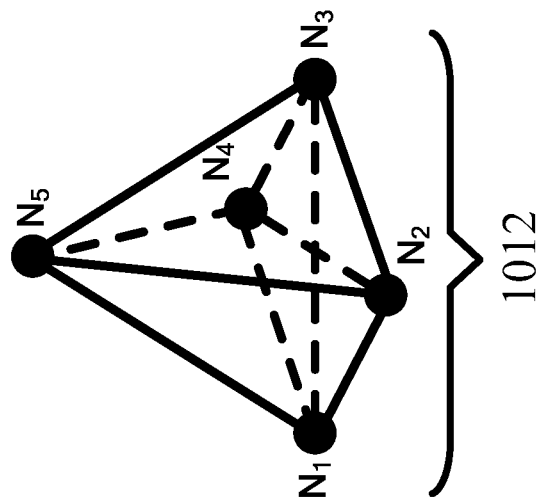
FIG. 10d is a block diagram illustrating a coupling scheme of an exemplary embodiment of a five-ring coupled ring oscillator according to the present application.

The phase diagram of ring oscillators is further illustrated in FIGS. 8 and 9 by using the examples of the DRO and TRO. In FIG. 8, since the 2nd order harmonics are coupled in DRO, the phase relationship at the common mode nodes of two rings are forced to be 0° and 180° in differential gain stage RO11 806 and RO21 810 leading to 90° phase shift at output phases between two rings shown in 804 and 808. In FIG. 9, in TRO, the phase relationship at the common mode nodes of three rings are forced to be 0°, 120°, and 240° respectively, as shown in the common mode nodes of the stages RO11 904, RO21 908 and RO31 912 in the TRO. As a result, the overall available output phases are extended three times, namely, the 1st ring covers 0°, 45°, 90° and 135° as well as their anti-phases 180°, 225°, 270° and 315°, while the 2nd and 3rd rings cover other 16 phases starting from 60° and 120°, respectively. Assuming the MRO contains M rings with N differential gain stages per ring, the available output phases are given by $$\varphi_{m,k} = \pi \cdot \left( \frac{m}{M} + \frac{2k}{N} \right),$$

m=0, 1, . . . , M−1, k=0, 1, . . . , N−1. Note that the listed output phases may be overlapped for some combinations of M and N (For example, the DRO case with 4 differential gain stages per ring. However, the TRO with 3 rings and 4 differential gain stages per ring provides non-overlapped 24 output phases. The increase of output phases doesn't come with penalty of reduced oscillation frequency, as the conventional SRO would require. Thus, high oscillation frequency and a large number of output phases can be achieved simultaneously. It should be pointed out that the MRO is not equivalent to duplicating rings and coupling them in-phase, which will not produce additional phases, nor will it enjoy the subtle noise reduction brought by the multiple-ring coupled scheme.

The concept can be generated to any M-ring coupled ring oscillator with N differential gain stages per ring. FIG. 7a, FIG. 7b, and FIG. 7c illustrate an example of a 4-ring coupled ring oscillator with 4 differential gain stages per ring. $N_1$, $N_2$, $N_3$ and $N_4$ denote common mode nodes of differential gain stages in each ring. Simulation shows further improved phase noise using this 4-ring coupled ring oscillator comparing to its TRO counterpart. The coupling scheme for DRO, TRO, 4-ring coupled oscillator, 5-ring coupled oscillator, and 6-ring coupled ring oscillator is further illustrated in FIG. 10a through 10e. Number of n in the node $N_n$ determines differential gain stage n's common mode node, while the line $N_nN_m$ determines the coupling path between differential gain stage n and m's common mode nodes, which includes a coupling capacitor omitted in FIGS. 10a through 10e for simplicity. The coupling scheme can be extended to M rings. For an M-ring coupled oscillator, there are M differential pairs and thus M common mode nodes in each differential gain stage that needs to be connected through capacitors. The number of capacitors used for M coupled ring in each differential gain stage is $$\frac{(M-1)M}{2}.$$

Figure 11:
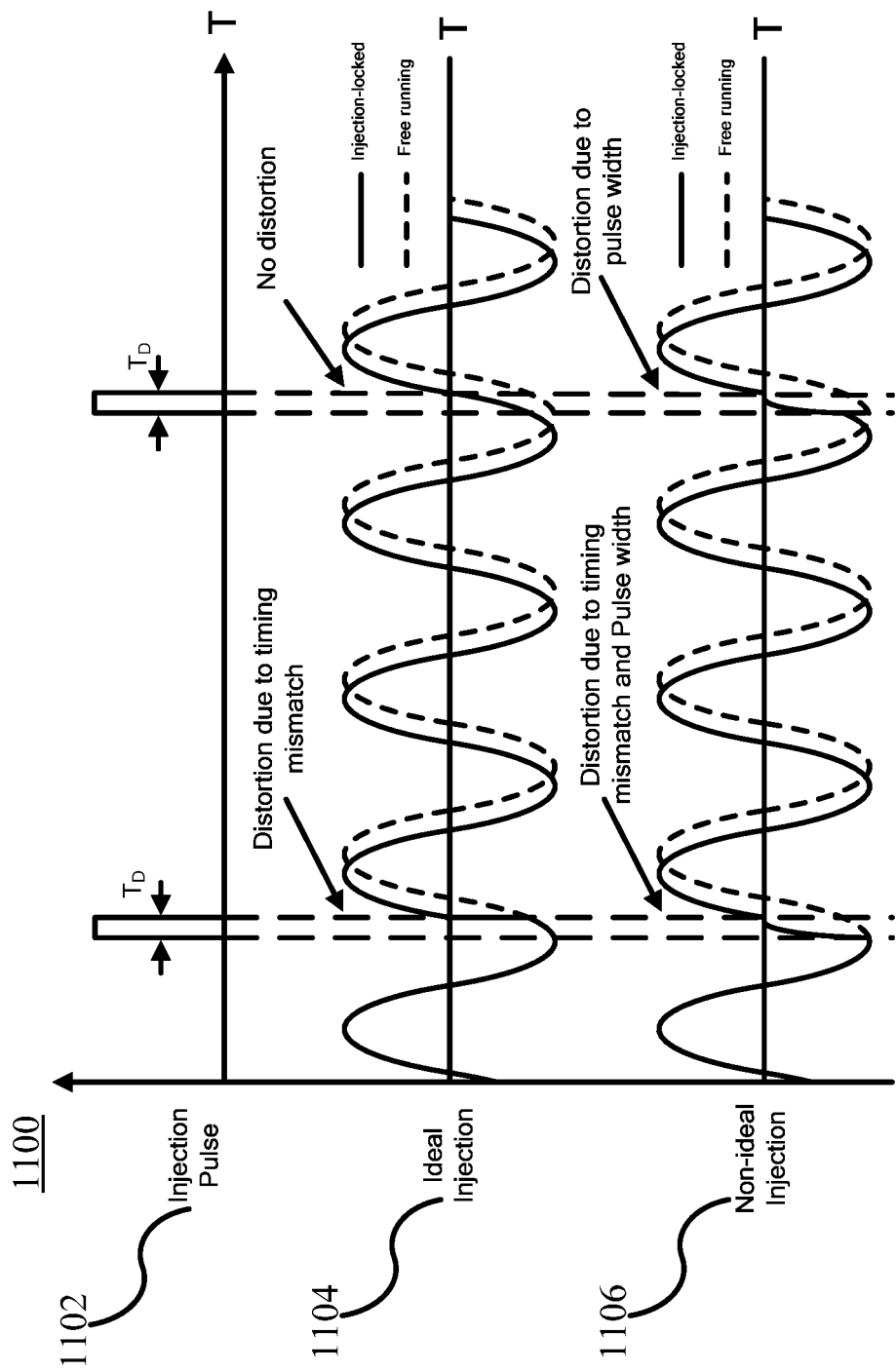
FIG. 11 is a graphical representation of distortion of an output waveform due to timing mismatch and non-ideal injection of an exemplary embodiment of the present application.

Referring to FIG. 11, one aspect of the present application is directed to a ring oscillator based IL-PLL. The reference spur in injection locking mainly comes from two sources: timing mismatches between injection signal and oscillation waveform 1104 and distortion in the output waveforms 1106 induced by injection pulses 1102 as illustrated in FIG. 11. Due to non-ideal injection 1106, the distortion may vary but always exists in the output waveform even if the injection happens at the output's zero crossing. Firstly, the TRO triples the number of output phases that can be used as a coarse phase tuning to calibrate the injection point for reference spur reduction. In addition, a tunable reference differential gain stage can provide fine calibration that further aligns the injection point to zero-crossing of the output waveform. The increased number of output phases available in an MRO can be used to relax the tuning range of the reference differential gain stages in timing calibration. Moreover, the reference signal may be injected into the only in one ring, called the "main ring", in an MRO structure. The outputs from other rings, called "auxiliary rings", can maintain the same phase noise, yet with much lower reference spur level. For example, the implemented TRO based IL-PLL, shown in FIG. 13, employs three identical rings 1312 coupled at the common mode nodes of the differential pairs. The reference pulses are injected into the main ring ($RO_{main}$), which causes reference spurs as shown in the conventional IL-PLLs. However, the reference spur level in $RO_{aux}$ is found to be at least 12 dB lower than that in the $RO_{main}$ since there is no injection pulse that periodically resets the oscillation waveform. In other words, the waveform existing in the auxiliary rings are much smoother and its phase noise is as good as the main ring waveform due to common source coupling as explained below. The design includes the DCDL 1302, pulse generator (Pulse Gen.) 1304, PFD/CP 1306, LF 1308, divider 1310, first stage 8 to 1 multiplexer 1314 and second stage 3 to 1 multiplexer 1316 in coarse tuning.

Analyzing the phase noise of $RO_{main}$ and $RO_{aux}$ begins with an analysis of phase noise in $RO_{main}$ without coupling with any auxiliary rings. Due to injection-locking, $RO_{main}$'s phase noise follows the reference's phase noise as $PN_{ref}+20 \log_{10}(N)$, where $PN_{ref}$ is the phase noise of reference signal. Intuitively, injection-locked $RO_{main}$ can be regarded as the signal source with phase noise of $PN_{ref}+20 \log_{10}(N)$. Through common source coupling, the signals at common source nodes in the $RO_{main}$ are injected into the $RO_{aux}$ with division ratio of 1, which indicates that the phase noise in $RO_{aux}$ should be the same as that of the $RO_{main}$.

Figure 12:
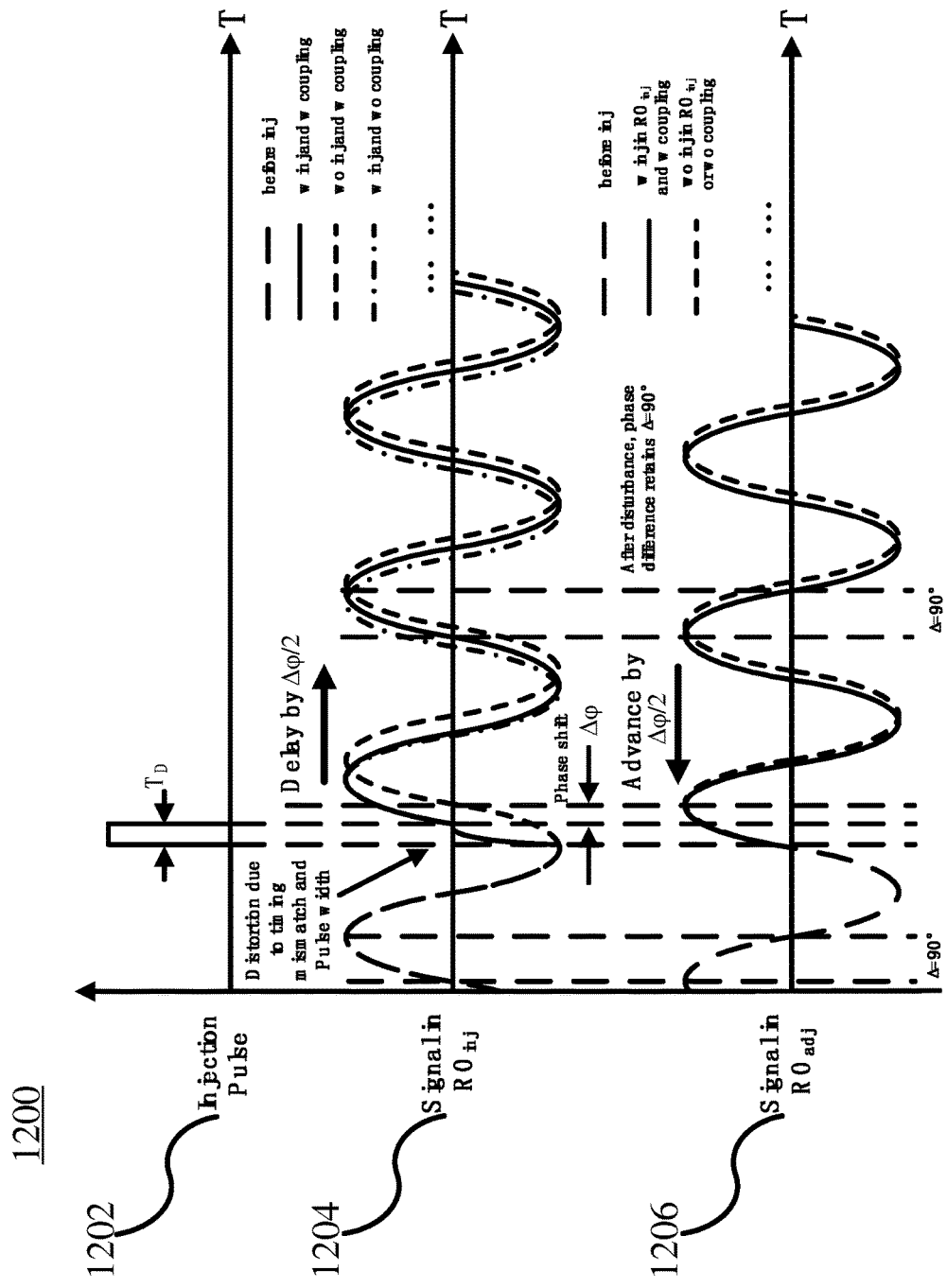
FIG. 12 is a graphical representation of a transient diagram of output waveforms in main and auxiliary rings in an exemplary IL-PLL using a DRO of an exemplary embodiment of the present application.

The concept of reference spur suppression in MRO is illustrated in FIG. 12. Using a DRO as an example, where the output phase relationship between $RO_{main}$ and $RO_{aux}$ is π/2 in stable state, while the waveforms at their common mode nodes have phase difference of π. The reference injection pulses TD 1202 resets the signal in $RO_{main}$ 1204 and causes the distortion of its output waveform, resulting in a phase shift of Δφ compared to the waveform without injection. This abrupt phase/amplitude jump causes reference spurs in the main ring. However, when it is coupled into the auxiliary ring as shown in 1206, the differential output waveform is not sensitive to AM since the perturbation is injected at the common mode nodes of the auxiliary ring. The only observable effect is the variation of its bias current that leads to slight frequency shift without abrupt phase jump. This subtle frequency shift is the key for auxiliary waveform to track the phase of the main waveform without noticeable waveform distortion that was the source of the reference spurs. The amount of frequent shift in the auxiliary ring is dependent upon the coupling strength, which dictates the amount of current coupled between the rings. After phase accumulation, the waveforms in auxiliary ring will eventually be phase-locked to that of the main ring, resulting in the same amount of phase correction (Δφ/2) to retain their stable state governed by their property of symmetry. Thus, the auxiliary ring outputs benefit from injection for phase noise reduction, yet without abrupt waveform distortion, which leads to greatly reduced reference spurs. It should be pointed out that coupling at the signal output nodes still introduces spurs from $RO_{main}$ to $RO_{aux}$ as the case using a phase interpolator in.

Figure 13:
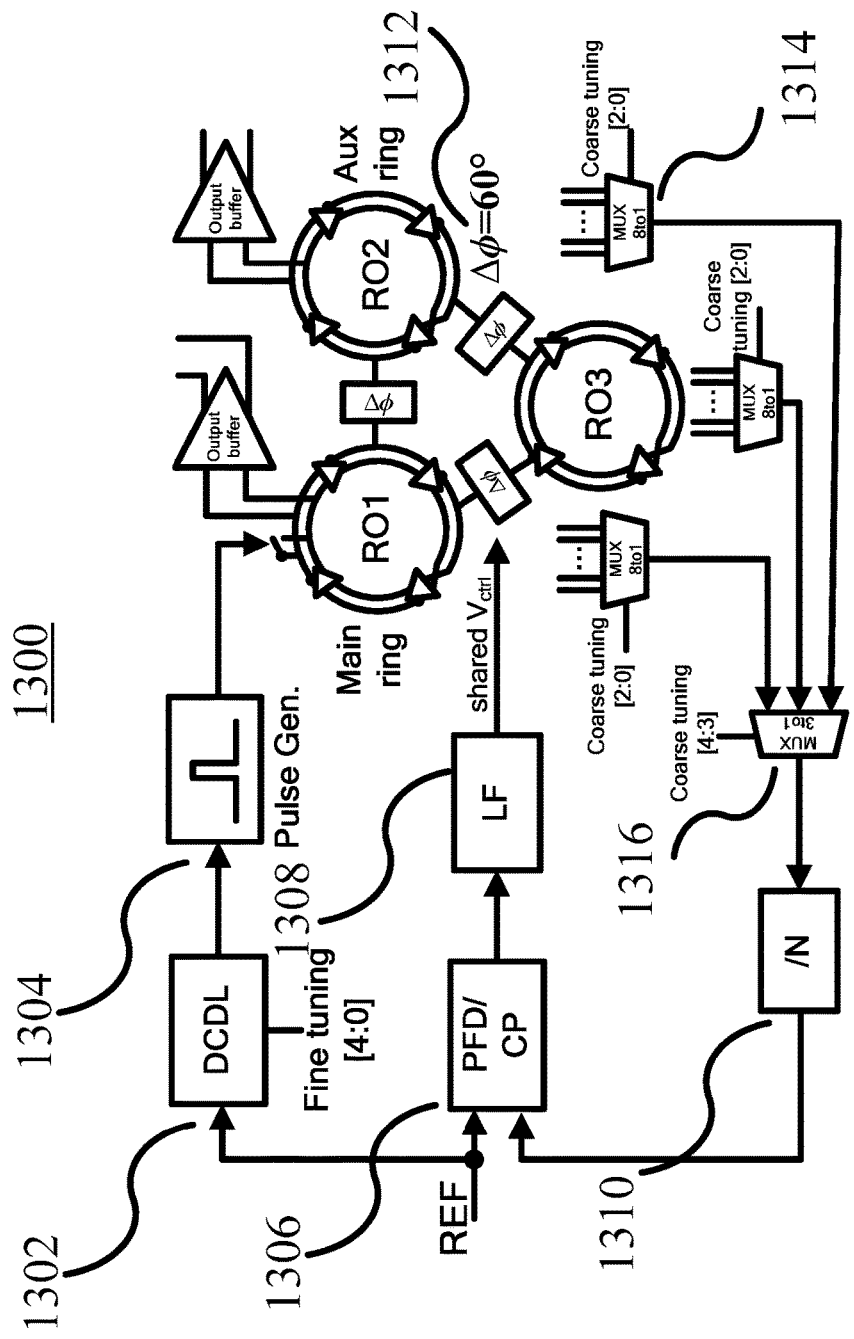
FIG. 13 is a block diagram illustrating a MRO-based IL-PLL according to the present application.
Figure 14:
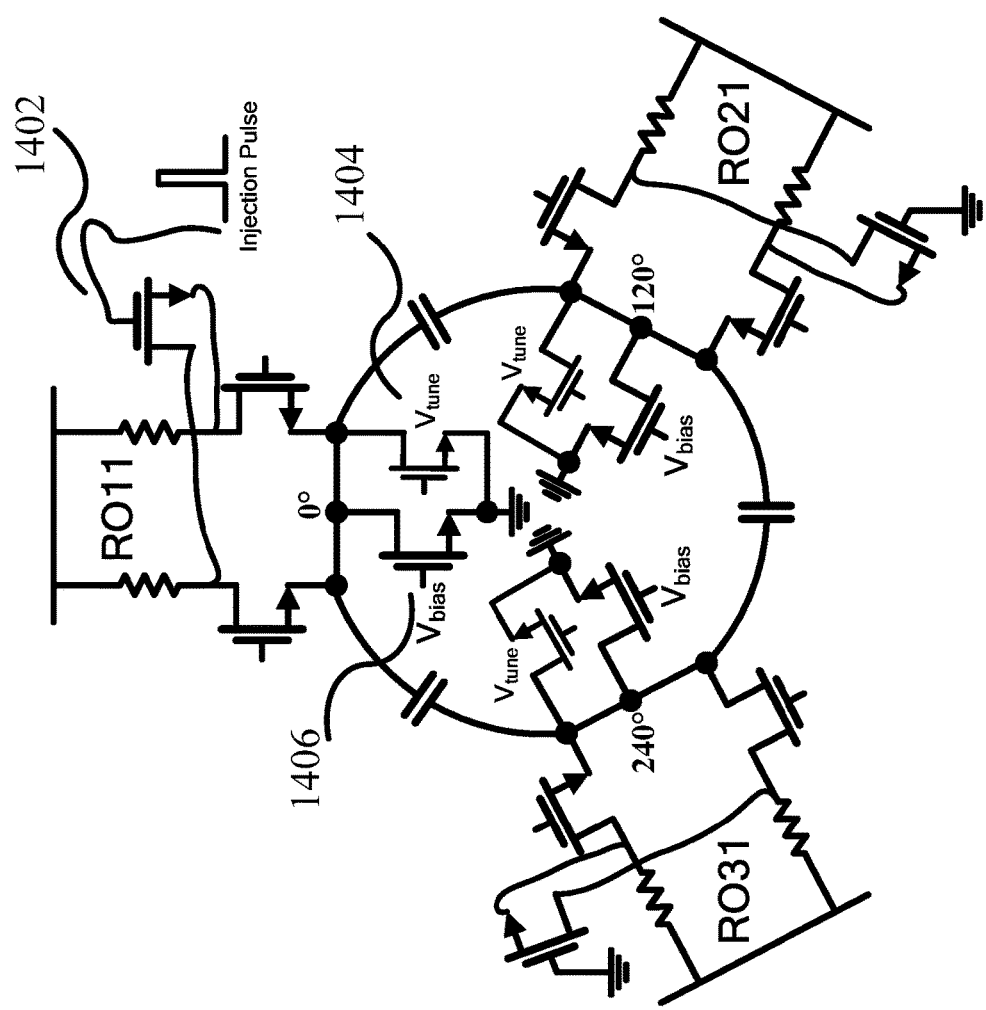
FIG. 14 is a schematic diagram illustrating an exemplary embodiment of one stage in an injection-locked triple ring coupled oscillator.

The MRO-based IL-PLL achieves improved phase noise and reference spur by coupling multiple rings through capacitive common source coupling. The available multi-phase outputs can also be utilized for injection timing calibration in conjunction with a tunable reference differential gain stage. The implemented IL-PLL architecture illustrated in FIG. 13 is composed of a TRO 1312, frequency divider, PFD/CP 1306, reference pulse generator (Pulse Gen.) 1304, and calibration unit with phase selector for coarse tuning 1314 and 1316 and DCDL 1302 for fine tune, as shown in FIG. 14. The reference injection signal from pulse generator is injected at the first stage of the main ring oscillator RO1 in the TRO. The outputs in auxiliary oscillators RO2 and RO3 as well as RO1 are buffered for outputs. One of the 24 output phases (the output phases number 2*M*N or 2MN), whose zero-crossing is closest to the reference edge, is fed back to the FLL that locks the ring oscillator output frequency to the Nth harmonic of the reference signal by using two stage multiplexers 1314 and 1316.

The exemplary circuit implementation of the injection-locked triple ring coupled ring oscillator (IL-TRO) is shown in FIG. 14. The TRO is formed by connecting three identical ring oscillators with 4 differential gain stages per ring through capacitive coupling paths with 60° phase shift. Differential pair with resistive load is employed as unit differential gain stages. The first stage, RO11, of the main ring in the TRO contains an injection switch 1402 for reference signal injection as illustrated in FIG. 14. Dummy switches are also added in the first stages of the auxiliary rings to keep the structure symmetry with balanced output load. The bottom transistor 1406 $V_{bias}$ is used to select a constant bias current of each stage. Tuning transistor 1404 frequency tuning voltage $V_{tune}$ is then applied to vary the bias current and thus tune the output frequency. Note that $V_{tune}$ is directly connected to the charge pump output denoted as $V_{ctrl}$ in FIG. 13.

The 24 output phases from the TRO can be utilized for injection timing calibration. Phase selection was done by monitoring the reference spurs. The lowest reference spur corresponds to an injection point that is closest to the zero-crossing of the output waveform. After the coarse phase selection, a DCDL is used to fine tune the injection point to further minimize the reference spur. To balance the loading and delay mismatch, a two-stage multiplexer is employed for phase selection. Multi-phase outputs in TRO reduces the required tuning range in the DCDL, leading to less in-band phase noise degradation due to reference differential gain stages. As the fine tune for the timing calibration, a 5-bit DCDL is formed using inverters with tunable capacitor arrays, which has a tuning range of 40 ps. The combination of 5-bit fine tuning and 5-bit coarse tuning covers the PVT variations and phase mismatches for frequency range from 800 MHz to 1.3 GHz in simulation.

A PLL with LC tank based VCO occupies a large area due to the associated inductors in the tank. Using inductors increases the fabrication cost and presents challenges for technology scaling. Ring-based VCO has been commonly adopted to implement an inductorless PLL. However, due to the inferior phase noise of ring oscillators, the achievable jitter performance is usually largely degraded compared with those using LC tank based VCOs. Recently, techniques including injection-locking and subsampling have achieved impressive in-band noise floor for PLLs. The penalty from inferior phase noise of ring-based VCOs can be largely eliminated given a very wide PLL loop bandwidth, while maintaining its benefit of small form factor and scalability with technology.

To achieve fractional frequency synthesis, conventional methods involving SDM-based MMD cannot be directly applied since the range of both injection locking and sub-sampling is much narrower compared with conventional tri-state PFDs. Approaches based on fractional injection and phase interpolator may resolve this issue. Generally, most of the approaches can be related to generating and switching between multiple VCO or reference phases. For ring-based VCO, multiple output phases are inherently generated within the ring, making it very convenient to implement fractional-N mode for PLLs. Furthermore, by utilizing multiple coupled ring oscillators, more output phases can be generated without decreasing oscillation frequency. Meanwhile, the coupled MROs with proper phase shift can achieve reduced phase noise comparing to their single-ring counterpart.

This disclosure presented a novel multiple-ring coupled ring oscillator design with effective phase noise reduction and increased number of output phases for multi-phase signal generation. The common source coupling technique with proper phase delay minimizes the noise injection and the tail current shaping further reduces current source noise up-conversion, thus leading to greatly improved FoM per output phase. In addition, coupling through common source nodes doesn't load the signal path, allowing high frequency. The stability and phase noise of the MRO circuits were analyzed and modeled. The effectiveness of the technique was verified with a 1~1.5 GHz 24 phase TRO fabricated in a 0.13 μm CMOS technology. The prototype achieved measured phase noise reduction of 7 dB compared to its SRO counterpart with PN at 1 MHz approaching −110.17 dBc/Hz and FoM reaching 162 dBc/Hz and FoM per phase reaching 176.8 dBc/Hz. Therefore, the inductor-less MRO provides an effective means for high frequency, low phase noise and low cost multi-phase clock generations.

Secondly, an inductor-less MRO topology can be used in IL-PLLs with 24 multi-phase outputs. The common source capacitive coupling introduces proper phase delay that minimizes the noise injection from auxiliary rings and the noise up-conversion from tail current sources, leading to greatly improved FoM per output phase. The TRO prototype achieved measured phase noise reduction of 7 dB compared to its SRO counterpart. It is also demonstrated that the common source coupling technique suppresses the reference spurs in auxiliary rings, while maintaining phase locking with its main ring where the reference pulses are injected. As a result, auxiliary ring outputs demonstrated 12 dB lower reference level comparing to the main ring outputs, while maintaining about the same phase noise. Furthermore, the available multiphase outputs in conjunction with a tunable reference differential gain stage with reduced tuning range are used to calibrate the injection timing, leading to greatly reduced reference spurs at −63 dBc with a 50 MHz reference. Therefore, the inductor-less MRO provides an area efficient technique for multi-phase clock generations with superior phase noise and spurious performances.

The functional block diagrams, operational sequences, and flow diagrams provided in the figures are representative of exemplary architectures, environments, and methodologies for performing novel aspects of the disclosure. While, for purposes of simplicity of explanation, the methodologies included herein may be in the form of a functional diagram, operational sequence, or flow diagram, and may be described as a series of acts, it is to be understood and appreciated that the methodologies are not limited by the order of acts, as some acts may, in accordance therewith, occur in a different order and/or concurrently with other acts from that shown and described herein. For example, those skilled in the art will understand and appreciate that a methodology can alternatively be represented as a series of interrelated states or events, such as in a state diagram. Moreover, not all acts illustrated in a methodology may be required for a novel implementation.

In the foregoing description, certain terms have been used for brevity, clearness, and understanding. No unnecessary limitations are to be inferred therefrom beyond the requirement of the prior art because such terms are used for descriptive purposes and are intended to be broadly construed. The different configurations, systems, and method steps described herein may be used alone or in combination with other configurations, systems and method steps. It is to be expected that various equivalents, alternatives and modifications are possible within the scope of the appended claims.

What is claimed is:

1. An apparatus comprising:
 a plurality of M ring oscillator circuits, where M is the number of ring oscillator circuits, each of the plurality of ring oscillator circuits having common mode nodes and a plurality of N differential gain stages, where N is the number of differential gain stages,
 wherein each of the plurality of common mode nodes are coupled with one another by phase shifters, such that a current source noise is reduced, and
 further wherein the plurality of ring oscillator circuits have a phase shift of 180/M degrees between the outputs of the plurality of ring oscillators circuits, such that a phase delay of the phase shift creates a noise reduction in an output of the apparatus.

2. The apparatus of claim 1, wherein the number N of the plurality of differential gain stages in each of the plurality of ring oscillator circuits is no less than 3.

3. The apparatus of claim 1, wherein each of the plurality of common mode nodes are coupled with one another by capacitors.

4. The apparatus of claim 3, wherein the number of capacitors used to couple each of the plurality of ring oscillator circuits in each of the plurality of differential gain stages is (M−1)M/2.

5. The apparatus of claim 1, wherein the apparatus has a number of output phases equal to 2MN.

6. The apparatus of claim 4, wherein at least two of the output phases overlap.

7. An apparatus comprising:
a multiple-ring coupled ring oscillator, comprising a plurality of M ring oscillator circuits, where M is the number of ring oscillator circuits, each of the plurality of ring oscillator circuits having common mode nodes and a plurality of N differential gain stages, where N is the number of differential gain stages,
wherein one of the plurality of ring oscillator circuits is a main ring oscillator circuit and at least one other of the plurality of ring oscillator circuits is an auxiliary ring oscillator circuit,
wherein each of the plurality of common mode nodes are coupled with one another, such that a current source noise is reduced,
wherein the plurality of ring oscillator circuits have a phase shift of 180/M degrees between the outputs of the plurality of ring oscillators circuits, such that a phase delay of the phase shift creates a noise reduction in an output of the apparatus,
wherein the main ring oscillator circuit has N differential gain stages, an input receiving an injection pulse, 2 outputs connected to an output buffer and 2N outputs connected to a first stage 2N to 1 multiplexer in coarse tuning, and
wherein the at least one auxiliary ring oscillator circuit has N differential gain stages, an input receiving a control voltage, 2 outputs connected to an output buffer and 2N outputs connected to another first stage 2N to 1 multiplexer in coarse tuning;
a digitally controlled delay line in fine tuning having an input receiving a reference signal and an output connected to an input of a pulse generator, the pulse generator having an output connected to the input of the main ring oscillator circuit to transmit the injection pulse;
a phase and frequency detector/charge pump having a plurality of inputs and an output, wherein one of the plurality of inputs receives the reference signal and the other of the plurality of inputs is connected to the output of a divider;
a loop filter having an input connected to the output of the phase and frequency detector/charge pump and an output connected to the input of the at least one auxiliary ring oscillator circuit to transmit the control voltage;
a second stage M to 1 multiplexer in coarse tuning having M inputs connected to each first stage 2N to 1 multiplexer and an output connected to the input of the divider.

8. The apparatus of claim 7, further comprising at least one additional auxiliary ring oscillator circuit having N differential gain stages, an input receiving a control voltage, 2 outputs connected to an output buffer and 2N outputs connected to another first stage 2N to 1 multiplexer in coarse tuning.

9. The apparatus of claim 7, wherein the at least one auxiliary ring oscillator circuit has the same phase noise as the main ring oscillator circuit and a lower reference spur level than the main ring oscillator circuit.

10. The apparatus of claim 7, wherein the input of the main ring oscillator circuit is an injection switch located in the first differential gain stage of the main ring oscillator circuit.

11. The apparatus of claim 10, wherein the at least one auxiliary ring oscillator circuit includes a dummy injection switch located in the first differential gain stage of the at least one auxiliary ring oscillator circuit.

12. The apparatus of claim 7, wherein a biasing voltage of a bottom transistor is used to select a constant bias current of each stage.

13. The apparatus of claim 12, wherein a frequency tuning voltage of a tuning transistor is applied to vary the bias current and thus tune the output frequency of each stage.

14. The apparatus of claim 12, wherein the tuning transistor is directly connected to the output of the phase and frequency detector/charge pump.

15. The apparatus of claim 7, wherein the multiple-ring coupled ring oscillator outputs a plurality of 2MN output phases.

16. The apparatus of claim 12, wherein one of the plurality of 2MN output phases is fed back to the divider, wherein the one of the plurality of 2MN output phases is the output phase whose zero-crossing is closest to the reference edge to lock a ring oscillator output frequency to the Nth harmonic of the reference signal.

17. The apparatus of claim 7, wherein the digitally controlled delay has a fine tuning of 4:0.

18. The apparatus of claim 7, wherein each first stage 2N to 1 multiplexer has a coarse tuning of 2:0 and the second stage M to 1 multiplexer has a coarse tuning of 4:3.

19. An apparatus comprising:
a plurality of M ring oscillator circuits, where M is the number of ring oscillator circuits, each of the plurality of ring oscillator circuits having common mode nodes and a plurality of N differential gain stages, where N is the number of differential gain stages;
one input; and
a plurality of outputs numbering 2MN,
wherein each of the plurality of common mode nodes are coupled with one another by phase shifters, such that a current source noise is reduced, and
further wherein the plurality of ring oscillator circuits have a phase shift of 180/M degrees between the outputs of the plurality of ring oscillators circuits, such that a phase delay of the phase shift creates a noise reduction in an output of the apparatus.

* * * * *